United States Patent
Ji et al.

(10) Patent No.: US 12,418,449 B2
(45) Date of Patent: Sep. 16, 2025

(54) OFDM-BASED METHOD AND DEVICE FOR SPREADING AND TRANSMITTING COMPRESSED DATA

(71) Applicant: SAMSUNG ELECTRONICS CO., LTD., Suwon-si (KR)

(72) Inventors: Hyoungju Ji, Suwon-si (KR); Hoondong Noh, Suwon-si (KR); Younsun Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 46 days.

(21) Appl. No.: 17/998,625

(22) PCT Filed: May 13, 2021

(86) PCT No.: PCT/KR2021/006023
§ 371 (c)(1),
(2) Date: Nov. 11, 2022

(87) PCT Pub. No.: WO2021/230685
PCT Pub. Date: Nov. 18, 2021

(65) Prior Publication Data
US 2023/0353435 A1   Nov. 2, 2023

(30) Foreign Application Priority Data

May 15, 2020 (KR) .......... 10-2020-0058585
Mar. 30, 2021 (KR) .......... 10-2021-0041130

(51) Int. Cl.
*H04L 27/26* (2006.01)
*H03M 7/30* (2006.01)

(52) U.S. Cl.
CPC ...... *H04L 27/2626* (2013.01); *H03M 7/3066* (2013.01)

(58) Field of Classification Search
CPC .... H04B 7/024; H04B 7/0857; H04B 7/0837; H04L 27/2626; H04L 5/0053;
(Continued)

(56) References Cited

U.S. PATENT DOCUMENTS 9,445,423 B2   9/2016   Noh et al.
10,425,198 B2  9/2019   Baligh et al.
(Continued)

FOREIGN PATENT DOCUMENTS

CN   110383924 A   10/2019
JP   2019525561 A   9/2019
(Continued)

OTHER PUBLICATIONS

Supplementary European Search Report dated Jul. 25, 2023, in connection with European Patent Application No. 21805168.8, 11 pages.
(Continued)

*Primary Examiner* — Vineeta S Panwalkar

(57) ABSTRACT

The present disclosure relates to a communication technique that merges IoT technology with a 5G communication system for supporting higher data transmission rates than 4G systems, and a system therefor. The present disclosure may be applied to intelligent services (for example, smart homes, smart buildings, smart cities, smart cars or connected cars, healthcare, digital education, retail business, security and safety-related services, etc.) on the basis of 5G communication technology and IoT-related technology. A method for a transmitter of a communication system according to the present disclosure is characterized by: transmitting configuration information for signal transmission to a receiver; checking resources for the signal transmission; transmitting scheduling information indicating the resources to the receiver; converting a transmission signal to a compressed
(Continued)

signal so as to correspond to the configuration information; spreading the compressed signal to multiple dimensions; mapping a portion of the spread compressed signal to the resources corresponding to the scheduling information; converting the spread compressed signal to generate an orthogonal frequency-division multiplexing (OFDM) signal; and transmitting the generated OFDM signal to the receiver.

22 Claims, 14 Drawing Sheets

(58) Field of Classification Search
CPC . H04L 5/0026; H04L 5/0044; H04L 27/2634; H04L 27/26532; H04L 27/30; H04L 27/2639; H03M 7/3066; H03M 7/3062
See application file for complete search history.

(56) References Cited

U.S. PATENT DOCUMENTS

| 10,958,318 | B2 | 3/2021 | Hong et al. |
| 2011/0261905 | A1 | 10/2011 | Shental et al. |
| 2019/0044649 | A1 | 2/2019 | Kim et al. |
| 2020/0036644 | A1* | 1/2020 | Belogolovy .......... H04L 1/0014 |
| 2020/0037350 | A1 | 1/2020 | Park et al. |
| 2020/0067735 | A1 | 2/2020 | Gao et al. |
| 2021/0144678 | A1* | 5/2021 | Tomeba ................. H04L 5/008 |

FOREIGN PATENT DOCUMENTS

| KR | 10-1684925 B1 | 12/2016 |
| KR | 10-2019-0014928 A | 2/2019 |
| KR | 10-2019-0107713 A | 9/2019 |
| KR | 10-2042651 B1 | 11/2019 |
| WO | 2017/049303 A1 | 3/2017 |
| WO | 2017087706 A1 | 5/2017 |

OTHER PUBLICATIONS

Zhang et al: "2D Structured Turbo Compressed Sensing for Channel Estimation in OTFS Systems", 2018 IEEE International Conference on Communication Systems (ICCS), 5 pages.
Ji et al: "Compressed OTFS Transmission over Millimeter-wave and Terahertz Spectrum", 2021 IEEE International Conference on Communications Workshops (ICC Workshops), 6 pages.
International Search Report and Written Opinion of the International Searching Authority dated Aug. 23, 2021, in connection with International Application No. PCT/KR2021/006023, 12 pages.
Office Action dated Mar. 11, 2025 corresponding to JP Application No. 2022-566710, 5 pages.
Office Action dated Mar. 21, 2025 corresponding to CN Application No. 202180035511.5, 21 pages.
Communication pursuant to Article 94(3) EPC dated Mar. 14, 2025 corresponding to EP Application No. 21 805 168.8, 8 pages.
Deka, K., et al., "OTFS-NOMA based on SCMA", arXiv:2005.03216v2 [cs.IT], May 2020, 13 pages.
Liang, Y., et al., "Doppler Resilient Orthogonal Time-Frequency Space (OTFS) Systems Based on Index Modulation", 2020 IEEE91st Vehicular Technology Conference (VTC2020-SPRING), May 2020, 5 pages.
Li, L., et al., "Performance Analysis and Optimization of Doppler Resilient Orthogonal Time Frequency Space Ststems", Southwest Jiaotong University, Master Degree Thesis, May 2019, 64 pages.

* cited by examiner

OFDM-BASED METHOD AND DEVICE FOR SPREADING AND TRANSMITTING COMPRESSED DATA

CROSS-REFERENCE TO RELATED APPLICATIONS

This application is a 371 of International Application No. PCT/KR2021/006023 filed May 13, 2021, which claims priority to Korean Patent Application No. 10-2020-0058585 filed May 15, 2020, and Korean Patent Application No. 10-2021-0041130 filed Mar. 30, 2021, the disclosures of which are herein incorporated by reference in their entirety.

BACKGROUND

1. Field

The disclosure relates to a technology for processing a signal in a wireless communication system and, more particularly, to a method and an apparatus for transmitting data to transmit a signal in an orthogonal frequency division multiplexing (OFDM)-based system.

2. Description of Related Art

To meet the demand for wireless data traffic having increased since deployment of 4G communication systems, efforts have been made to develop an improved 5G or pre-5G communication system. Therefore, the 5G or pre-5G communication system is also called a "beyond 4G network" communication system or a "post long term evolution (post LTE)" system. The 5G communication system is considered to be implemented in ultrahigh frequency (mmWave) bands (e.g., 60 GHz bands) so as to accomplish higher data rates. To decrease propagation loss of the radio waves and increase the transmission distance in the ultrahigh frequency bands, beamforming, massive multiple-input multiple-output (massive MIMO), full dimensional MIMO (FD-MIMO), array antenna, analog beam forming, large scale antenna techniques are discussed in 5G communication systems. In addition, in 5G communication systems, development for system network improvement is under way based on advanced small cells, cloud radio access networks (RANs), ultra-dense networks, device-to-device (D2D) communication, wireless backhaul, moving network, cooperative communication, coordinated multi-points (CoMP), reception-end interference cancellation and the like. In the 5G system, hybrid FSK and QAM modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have also been developed.

The Internet, which is a human centered connectivity network where humans generate and consume information, is now evolving to the Internet of things (IoT) where distributed entities, such as things, exchange and process information without human intervention. The Internet of everything (IoE), which is a combination of the IoT technology and the big data processing technology through connection with a cloud server, has emerged. As technology elements, such as "sensing technology", "wired/wireless communication and network infrastructure", "service interface technology", and "security technology" have been demanded for IoT implementation, a sensor network, a machine-to-machine (M2M) communication, machine type communication (MTC), and so forth have been recently researched. Such an IoT environment may provide intelligent Internet technology (IT) services that create a new value to human life by collecting and analyzing data generated among connected things. IoT may be applied to a variety of fields including smart home, smart building, smart city, smart car or connected cars, smart grid, health care, smart appliances and advanced medical services through convergence and combination between existing information technology (IT) and various industrial applications.

In line with this, various attempts have been made to apply 5G communication systems to IoT networks. For example, technologies such as a sensor network, machine type communication (MTC), and machine-to-machine (M2M) communication may be implemented by beamforming, MIMO, and array antennas. Application of a cloud radio access network (cloud RAN) as the above-described big data processing technology may also be considered an example of convergence of the 5G technology with the IoT technology.

Further, for a future communication system, a method of transmitting a signal in a super-high frequency band is being researched to implement a higher data transmission rate.

SUMMARY

An aspect of the disclosure is to provide a method and an apparatus for transmitting data robust to noise in a system in which internal noise of a transmitter and a receiver is large such as in band from a super-high frequency to a Terahertz wave.

A method of a transmitter in a wireless communication system according to the disclosure to solve the problems includes: transmitting configuration information for transmitting signals to a receiver; converting the transmitted signals into compressed signals in accordance with the configuration information; spreading the compressed signals to multiple dimensions; mapping some of the spread compressed signals to the resources corresponding to the scheduling information; and multiplexing the signals with other signals to generate OFDM signals and transmitting the generated OFDM signals.

The method may further include transmitting Doppler spread, channel spread, or profile information corresponding thereto through channel information feedback from the receiver or making the transmitter recognize the same.

A method of a receiver in a wireless communication system includes: receiving configuration information for receiving signals from a transmitter; receiving scheduling information for receiving the signals from the transmitter; reconstructing the received signals, based on the configuration information and the scheduling information; and decompressing the reconstructed signals to acquire transmission information.

A transmitter in a wireless communication system includes a transmitter; and a controller connected to the transceiver and configured to perform control to transmit configuration information for transmitting signals to a receiver, generate transmitted signals, based on the configuration information, transmit control information including resource allocation information indicating signal allocation resources to the receiver, generate transmitted signals obtained by applying multi-dimensional spread to modulated signals to be transmitted, and transmit the generated transmitted signals in the signal allocation resources to the receiver.

In a receiver in a wireless communication system includes: a transmitter; and a controller connected to the transceiver and configured to receive configuration information for transmitting signals from a transmitter, storing samples for signal processing for generating transmitted signals, based on the configuration information, receive control information including resource allocation information indicating signal allocation resources from the transmitter, receive received signals in the signal allocation resources from the transmitter, and reconstruct compressed data information in the received signal.

According to an embodiment of the disclosure, there is an effect of outstandingly reconstructing signals in a system having series internal noise and, particularly, effectively reconstructing signals through transmission of only some of the spread signals by compressing transmitted data and spreading and transmitting the same to multiple dimensions.

DETAILED DESCRIPTION

Figure 1:
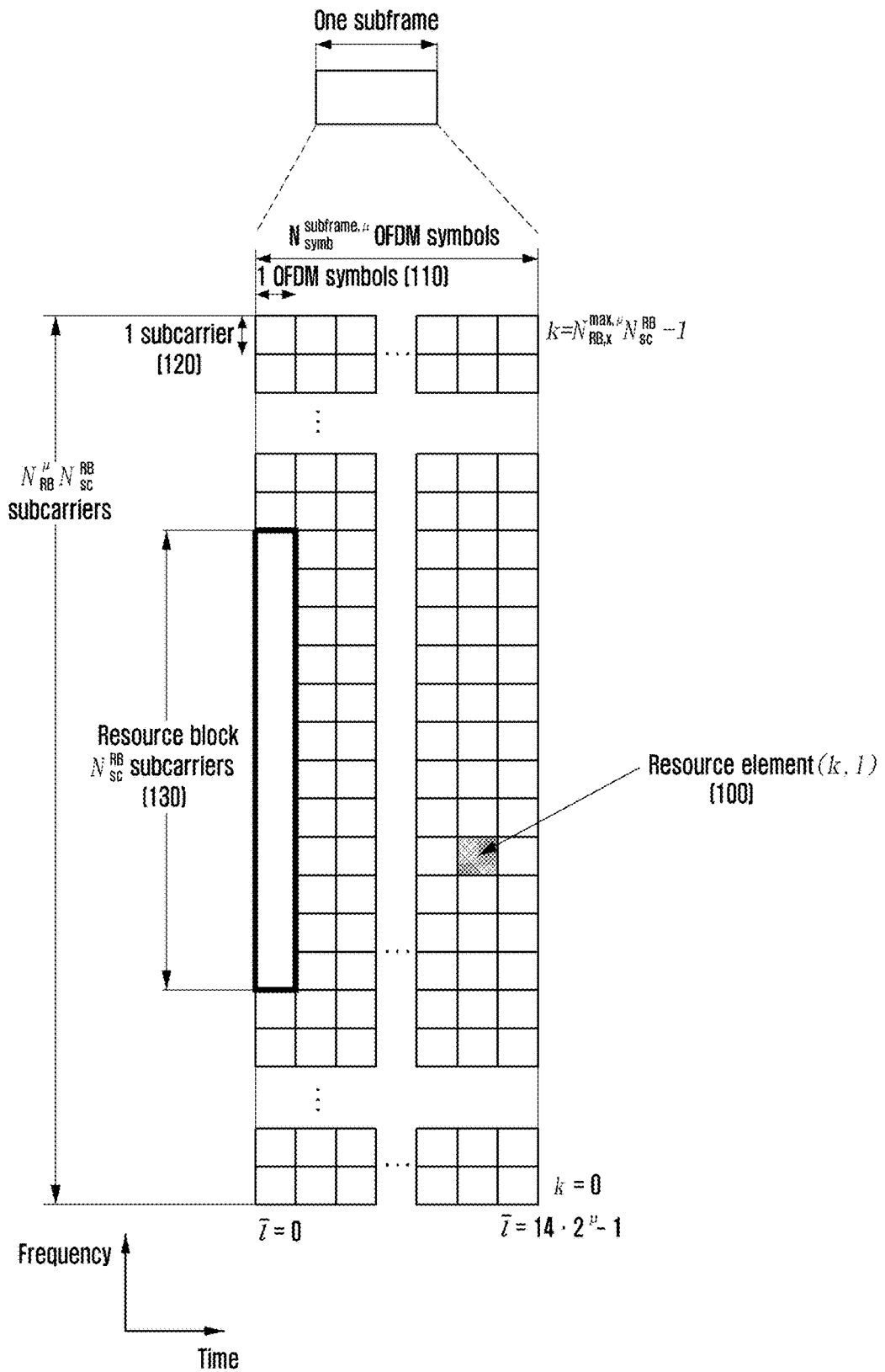
FIG. 1 illustrates a basic structure of a time-frequency domain that is a wireless resource area in which data or control channels of a 5G system are transmitted.

Hereinafter, embodiments of the disclosure will be described in detail with reference to the accompanying drawings.

In describing the embodiments, descriptions related to technical contents well-known in the art to which the disclosure pertains and not associated directly with the disclosure will be omitted. Such an omission of unnecessary descriptions is intended to prevent obscuring of the main idea of the disclosure and more clearly transfer the main idea.

For the same reason, in the accompanying drawings, some elements may be exaggerated, omitted, or schematically illustrated. Further, the size of each element does not completely reflect the actual size. In the drawings, identical or corresponding elements are provided with identical reference numerals.

The advantages and features of the disclosure and ways to achieve them will be apparent by making reference to embodiments as described below in detail in conjunction with the accompanying drawings. However, the disclosure is not limited to the embodiments set forth below, but may be implemented in various different forms. The following embodiments are provided only to completely disclose the disclosure and inform those skilled in the art of the scope of the disclosure, and the disclosure is defined only by the scope of the appended claims. Throughout the specification, the same or like reference numerals designate the same or like elements.

Herein, it will be understood that each block of the flowchart illustrations, and combinations of blocks in the flowchart illustrations, can be implemented by computer program instructions. These computer program instructions can be provided to a processor of a general-purpose computer, special purpose computer, or other programmable data processing apparatus to produce a machine, such that the instructions, which execute via the processor of the computer or other programmable data processing apparatus, create means for implementing the functions specified in the flowchart block or blocks. These computer program instructions may also be stored in a computer usable or computer-readable memory that can direct a computer or other programmable data processing apparatus to function in a particular manner, such that the instructions stored in the computer usable or computer-readable memory produce an article of manufacture including instruction means that implement the function specified in the flowchart block or blocks. The computer program instructions may also be loaded onto a computer or other programmable data processing apparatus to cause a series of operational steps to be performed on the computer or other programmable apparatus to produce a computer implemented process such that the instructions that execute on the computer or other programmable apparatus provide steps for implementing the functions specified in the flowchart block or blocks.

Further, each block of the flowchart illustrations may represent a module, segment, or portion of code, which includes one or more executable instructions for implementing the specified logical function(s). It should also be noted that in some alternative implementations, the functions noted in the blocks may occur out of the order. For example, two blocks shown in succession may in fact be executed substantially concurrently or the blocks may sometimes be executed in the reverse order, depending upon the functionality involved.

As used in embodiments of the disclosure, the "unit" refers to a software element or a hardware element, such as a Field Programmable Gate Array (FPGA) or an Application Specific Integrated Circuit (ASIC), which performs a predetermined function. However, the "unit" does not always have a meaning limited to software or hardware. The "unit" may be constructed either to be stored in an addressable storage medium or to execute one or more processors. Therefore, the "unit" includes, for example, software elements, object-oriented software elements, class elements or task elements, processes, functions, properties, procedures, sub-routines, segments of a program code, drivers, firmware, micro-codes, circuits, data, database, data structures, tables, arrays, and parameters. The elements and functions provided by the "unit" may be either combined into a smaller number of elements, or a "unit", or divided into a larger number of elements, or a "unit". Moreover, the elements and "units" or may be implemented to reproduce one or more CPUs within a device or a security multimedia card. Further, according to some embodiments, the "unit" may include one or more processors.

Hereinafter, the operation principle of the technical idea of the disclosure will be described in detail with reference to the accompanying drawings. In the following description of the technical idea of the disclosure, a detailed description of known functions or configurations incorporated herein will be omitted when it is determined that the description may make the subject matter of the disclosure unnecessarily unclear. The terms which will be described below are terms defined in consideration of the functions in the disclosure, and may be different according to users, intentions of the users, or customs. Therefore, the definitions of the terms should be made based on the contents throughout the specification.

In the following description, a base station is an entity that allocates resources to terminals, and may be at least one of a gNode B, an eNode B, a Node B, a base station (BS), a wireless access unit, a base station controller, and a node on a network. A terminal may include a user equipment (UE), a mobile station (MS), a cellular phone, a smartphone, a computer, or a multimedia system capable of performing communication functions. Of course, examples of the base station and the terminal are not limited thereto. In the following description of the disclosure, technology for receiving broadcast information from a base station by a terminal in a wireless communication system will be described. The disclosure relates to a communication technique for converging Internet of things (IoT) technology with 5th generation (5G) communication systems designed to support a higher data transfer rate beyond 4th generation (4G) systems, and a system therefor. The disclosure may be applied to intelligent services (e.g., smart homes, smart buildings, smart cities, smart cars or connected cars, healthcare, digital education, retail business, security and safety-related services, etc.) on the basis of 5G communication technology and IoT-related technology.

In the following description, terms referring to broadcast information, terms referring to control information, terms related to communication coverage, terms referring to state changes (e.g., an event), terms referring to network entities, terms referring to messages, terms referring to device elements, and the like are illustratively used for the sake of convenience. Therefore, the disclosure is not limited by the terms as used below, and other terms referring to subjects having equivalent technical meanings may be used.

In the following description, some of terms and names defined in the 3rd generation partnership project (3GPP) LTE or NR standards may be used for the convenience of description. However, the disclosure is not limited by these terms and names, and may be applied in the same way to systems that conform other standards.

A wireless communication system is advancing to a broadband wireless communication system for providing high-speed and high-quality packet data services using communication standards, such as high-speed packet access (HSPA) of 3GPP, LTE {long-term evolution or evolved universal terrestrial radio access (E-UTRA)}, LTE-Advanced (LTE-A), LTE-Pro, high-rate packet data (HRPD) of 3GPP2, ultra-mobile broadband (UMB), IEEE 1102.16e, and the like, as well as typical voice-based services.

As a typical example of the broadband wireless communication system, an LTE system employs an orthogonal frequency division multiplexing (OFDM) scheme in a downlink (DL) and employs a single carrier frequency division multiple access (SC-FDMA) scheme in an uplink (UL). The uplink indicates a radio link through which a user equipment (UE) {or a mobile station (MS)} transmits data or control signals to a base station (BS) (eNode B), and the downlink indicates a radio link through which the base station transmits data or control signals to the UE. The above multiple access scheme separates data or control information of respective users by allocating and operating time-frequency resources for transmitting the data or control information for each user so as to avoid overlapping each other, that is, so as to establish orthogonality.

Since a 5G communication system, which is a post-LTE communication system, must freely reflect various requirements of users, service providers, and the like, services satisfying various requirements must be supported. The services considered in the 5G communication system include enhanced mobile broadband (eMBB) communication, massive machine-type communication (mMTC), ultra-reliability low-latency communication (URLLC), and the like.

According to some embodiments, eMBB aims at providing a data rate higher than that supported by existing LTE, LTE-A, or LTE-Pro. For example, in the 5G communication system, eMBB must provide a peak data rate of 20 Gbps in the downlink and a peak data rate of 10 Gbps in the uplink for a single base station. Furthermore, the 5G communication system must provide an increased user-perceived data rate to the UE, as well as the maximum data rate. In order to satisfy such requirements, transmission/reception technologies including a further enhanced multi-input multi-output (MIMO) transmission technique are required to be improved. In addition, the data rate required for the 5G communication system may be obtained using a frequency bandwidth more than 20 MHz in a frequency band of 3 to 6 GHz or 6 GHz or more, instead of transmitting signals using a transmission bandwidth up to 20 MHz in a band of 2 GHz used in LTE.

In addition, mMTC is being considered to support application services such as the Internet of Things (IoT) in the 5G communication system. mMTC has requirements, such as support of connection of a large number of UEs in a cell, enhancement coverage of UEs, improved battery time, a reduction in the cost of a UE, and the like, in order to effectively provide the Internet of Things. Since the Internet of Things provides communication functions while being provided to various sensors and various devices, it must support a large number of UEs (e.g., 1,000,000 UEs/km2) in a cell. In addition, the UEs supporting mMTC may require wider coverage than those of other services provided by the 5G communication system because the UEs are likely to be located in a shadow area, such as a basement of a building, which is not covered by the cell due to the nature of the service. The UE supporting mMTC must be configured to be inexpensive, and may require a very long battery life-time because it is difficult to frequently replace the battery of the UE.

Lastly, URLLC, which is a cellular-based mission-critical wireless communication service, may be used for remote control for robots or machines, industrial automation, unmanned aerial vehicles, remote health care, emergency alert, and the like. Thus, URLLC must provide communication with ultra-low latency and ultra-high reliability. For example, a service supporting URLLC must satisfy an air interface latency of less than 0.5 ms, and also requires a packet error rate of 10-5 or less. Therefore, for the services supporting URLLC, a 5G system must provide a transmit time interval (TTI) shorter than those of other services, and also requires a design for assigning a large number of resources in a frequency band in order to secure reliability of a communication link. However, the above-described mMTC, URLLC, and eMBB are only examples of different types of services, and service types to which the disclosure is applicable are not limited to the above-described examples.

The above-described services considered in the 5G communication system must be converged with each other so as to be provided based on one framework. That is, the respective services are preferably integrated into a single system and controlled and transmitted in the integrated single system, instead of being operated independently, for efficient resource management and control.

Hereinafter, the frame structure of the 5G system will be described in more detail with reference to the drawings.

FIG. 1 illustrates a basic structure of a time-frequency domain that is a wireless resource area in which data or control channels of a 5G system are transmitted.

Referring to FIG. 1, the horizontal axis indicates a time domain and the vertical axis indicates a frequency domain in FIG. 1. A basic unit of resources in the time and frequency domains is a resource element (RE) 100 and may be defined as one OFDM symbol 110 in the time axis and one subcarrier 120 in the frequency axis. In the frequency domain, $N_{sc}^{RB}$ (for example, 12) consecutive REs may constitute one Resource Block (RB) 130.

Figure 2:
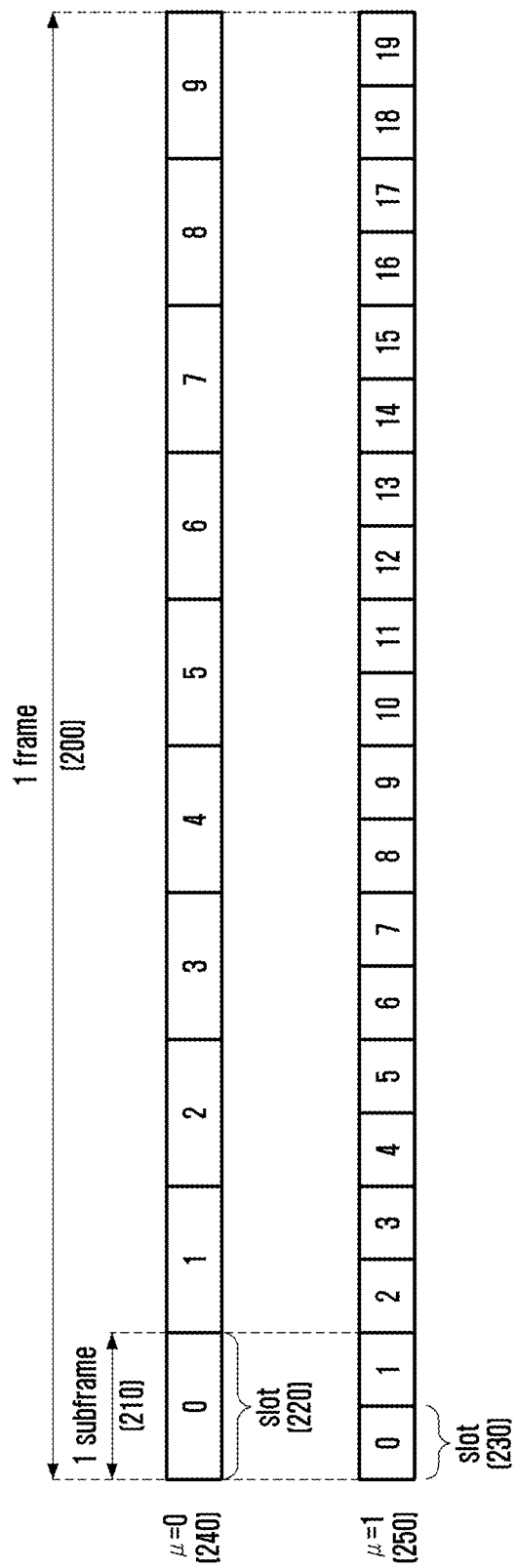
FIG. 2 illustrates the frame, subframe, and slot structure in a 5G system.

FIG. 2 illustrates the frame, subframe, and slot structure in a 5G system.

Referring to FIG. 2, an example of the structure of a frame 200, a subframe 210, and a slot 220 is illustrated. One frame 200 may be defined as 10 ms. One subframe 210 may be defined as 1 ms, and one frame 200 may include a total of 10 subframes 210. One slot 220 or 230 may be defined as 14 OFDM symbols (that is, the number of symbols ($N_{symb}^{slot}$) per slot=14). One subframe 210 may include one or a plurality of slots 220 or 230, and the number of slots 220 or 230 per subframe 210 may vary depending on a configuration value μ 240 or 250 for subcarrier spacing.

In the example of FIG. 2, the case in which the subcarrier spacing set values μ=0 240 and μ=1 250 is illustrated. In the case of μ=0 240, one subframe 210 may consist of one slot 2220. In the case of μ=1 250, one subframe 210 may consist of two slots 230. That is, the number of slots ($N_{slot}^{subframe,\mu}$) per subframe may be different according to the configuration value μ for subcarrier spacing, and accordingly, the number of slots ($N_{slot}^{frame,\mu}$) per frame may be different. $N_{slot}^{subframe,\mu}$ and $N_{slot}^{frame,\mu}$ according to each subcarrier spacing configuration p may be defined as shown in [Table 1] below.

TABLE 1

| μ | Subcarrier spacing (kHz) | $N_{symb}^{slot}$ | $N_{slot}^{frame,\mu}$ | $N_{slot}^{subframe,\mu}$ |
| --- | --- | --- | --- | --- |
| 0 | 15 | 14 | 10 | 1 |
| 1 | 30 | 14 | 20 | 2 |
| 2 | 60 | 14 | 40 | 4 |
| 3 | 120 | 14 | 80 | 8 |
| 4 | 240 | 14 | 160 | 16 |
| 5 | 480 | 14 | 320 | 32 |
| 6 | 960 | 14 | 640 | 64 |

In NR, one component carrier (CC) or serving cell may include a maximum of 250 RBs. Accordingly, when the UE always receives entire serving cell bandwidths like in LTE, power consumption of the UE may be very large, and thus in order to solve the problem, the BS may configure one or more bandwidth parts (BWPs) in the UE and support the UE to change a reception area within the cell. In NR, the BS may configure an 'initial BWP' which is a bandwidth of CORE-SET #0 (or common search space (CSS)) in the UE through a master information block (MIB). Thereafter, the BS may configure a first BWP of the UE through radio resource control (RRC) signaling and notify of one or more pieces of BWP configuration information which can be indicated through downlink control information (DCI) in the future. Accordingly, the BS may indicate which band will be used by the UE by notifying of a BWP ID through DCI. If the UE does not receive the DCI in the currently allocated BWP for a specific time or longer, the UE may return to a default BWP and attempt reception of the DCI.

Subsequently, downlink control information (DCI) in the 5G system is described in detail.

In the 5G system, scheduling information for uplink data (or a physical uplink data channel (physical uplink shared channel (PUSCH)) or downlink data (or physical downlink data channel (physical downlink shared channel (PDSCH)) is transmitted from the BS to the UE through DCI. The UE may monitor a fallback DCI format and a non-fallback DCI format for the PUSCH or the PDSCH. The fallback DCI format may include a fixed field predefined between the BS and the UE, and the non-fallback DCI format may include a configurable field.

The DCI may be transmitted through a physical downlink control channel (PDCCH) via a channel coding and modulation process. A cyclic redundancy check (CRC) is added to a DCI message payload and is scrambled with a radio network temporary identifier (RNTI) corresponding to the identity of the terminal. Depending on the purpose of the DCI message, for example, UE-specific data transmission, a power control command, or a random access response, different RNTIs are used. That is, the RNTI is not explicitly transmitted but is included in a CRC calculation process to be transmitted. If the DCI message transmitted through the PDCCH is received, the UE may identify the CRC through the allocated RNTI, and may recognize that the corresponding message is transmitted to the UE when the CRC is determined to be correct on the basis of the CRC identification result.

DCI format 1_0 may be used for fallback DCI for scheduling a PDSCH in which case the CRC may be scrambled by a C-RNTI. DCI format 1_0 in which the CRC is scrambled by the C-RNTI may include, for example, information in [Table 2] below.

TABLE 2

Identifier for DCI formats - [1] bit
Frequency domain resource assignment -
[ ⌈ $log_2(N_{RB}^{DL,BWP}(N_{RB}^{DL,BWP}+1)/2)$ ⌉ ] bits
Time domain resource assignment - 4 bits
VRB-to-PRB mapping - 1 bit
Modulation and coding scheme - 5 bits
New data indicator - 1 bit
Redundancy version - 2 bits
HARQ process number - 4 bits
Downlink assignment index - 2 bits
TPC command for scheduled PUCCH - [2] bits
physical uplink control channel (PUCCH) resource indicator - 3 bits
PDSCH-to-HARQ feedback timing indicator - [3] bits DCI format 1_1 may be used for non-fallback DCI for scheduling a PDSCH in which case the CRC may be scrambled by a C-RNTI. DCI format 1_1 in which the CRC is scrambled by the C-RNTI may include, for example, information in [Table 3] below.

TABLE 3

Carrier indicator - 0 or 3 bits
Identifier for DCI formats - [1] bits
Bandwidth part indicator - 0, 1 or 2 bits
Frequency domain resource assignment
   o For resource allocation type 0,
   ⌈ $N_{RB}^{DL,BWP}/P$ ⌉ bits
   o For resource allocation type 1,
   ⌈ $\log_2(N_{RB}^{DL,BWP}(N_{RB}^{DL,BWP}+1)/2)$ ⌉ bits
Time domain resource assignment - 1, 2, 3, or 4 bits
VRB-to-PRB mapping - 0 or 1 bit, only for resource allocation type 1.
   o 0 bit if only resource allocation type 0 is configured;
   o 1 bit otherwise.
Physical resource block (PRB) bundling size indicator - 0 or 1 bit
Rate matching indicator - 0, 1, or 2 bits
Zero power (ZP) channel state information (CSI)-reference signal (RS) trigger - 0, 1, or 2 bits
For transport block 1:
Modulation and coding scheme - 5 bits
New data indicator - 1 bit
Redundancy version - 2 bits
For transport block 2:
Modulation and coding scheme - 5 bits
New data indicator - 1 bit
Redundancy version - 2 bits
HARQ process number - 4 bits
Downlink assignment index - 0 or 2 or 4 bits
TPC command for scheduled PUCCH - 2 bits
PUCCH resource indicator - 3 bits
PDSCH-to-HARQ_feedback timing indicator - 3 bits
Antenna ports - 4, 5 or 6 bits
Transmission configuration indication (TCI) - 0 or 3 bits
SRS request - 2 bits
CBG transmission information - 0, 2, 4, 6, or 8 bits
Code block group (CBG) flushing out information - 0 or 1 bit
- DMRS sequence initialization - 1 bit In the 5G system, during a process of transmitting an OFDM signal, an encoded symbol (or encoded bit) is converted into a modulated symbol through modulation, and M modulated symbols are gathered and converted into parallel signals through a serial-to-parallel (S/P) converter. The M converted symbols are mapped to desired subcarrier locations and then converted into OFDM signals through the application of inverse fast Fourier transform (IFFT). A converted time sample is converted into a serial time sample through parallel-to-serial (P/S), a cyclic prefix is concatenated therewith, and then a signal is generated via a digital-to-analog converter (DAC) and a radio frequency (RF). The OFDM signal can be transmitted in band from a low frequency band to a high frequency band. However, when the high frequency band is used, very high power consumption is generated due to a high sampling rate, a wide bandwidth, and low hardware efficiency, and thus a receiver cannot always maintain an active state and can wake up only when receiving data. When the receiver wakes up within a very short time interval to receive and process data while minimizing the performance deterioration, there should be sufficient additional information before a receiver signal processing. In the conventional cellular communication system, some resources (generally, 20% or more) may be used to transmit and receive pilot signals in order to support acquisition of channel information required for synchronizing and demodulating time, frequencies, and/or Doppler.

A bottleneck phenomenon generated when a signal is processed for a short time in a high frequency band is described below. A phase is changed by internal noise generated by an RF device, which is called phase noise and causes serious performance deterioration of the receiver.

That is, when a frequency band used for transmitting and receiving a signal is significantly high, it is more difficult to achieve the reception accuracy at the same level through the same amount of resources for pilot signals. To this end, a method of minimizing required overheads and obtaining data channel information desired for signals damaged by the noise is needed.

Hereinafter, "d" denotes a delay domain of a channel, "D" nodes a Doppler domain of a channel, "t" denotes a time domain of a channel, and "f" denotes a frequency domain of a channel. "d-D" denotes a two-dimensional domain of delay and Doppler, and "t-f" denotes a two-dimensional domain of time and frequency.

According to a method proposed in the disclosure, a transmitter applies symbol mapping in a d-D resource grid (that is, two-dimensional grids of Nd×ND), and an actual data packet is transmitted using a t-f resource grid (that is, a two-dimensional grid of NF×NT) like an OFDM-based multi-carrier signal. In order to acquire 2nd order statistics of channels between the transmitter and the receiver, that is, information on Doppler spread LD (in units of symbols) and delay spread Ld (in units of samples), the transmitter and the receiver feed back channel information which the receiver or the transmitter acquired on the basis of a channel and/or a signal (for example, a channel state information reference signal or a CSI-RS), a synchronization signal, or the like) to the transmitter or the receiver or acquire channel information corresponding thereto by using a channel and a signal which can be acquired (sounding reference signal, an SRS, or the like). Accordingly, the number of two-dimensional resources which can be used in the area d-D may be Nd×ND=NF/Ld×NT/LD.

Figure 3:
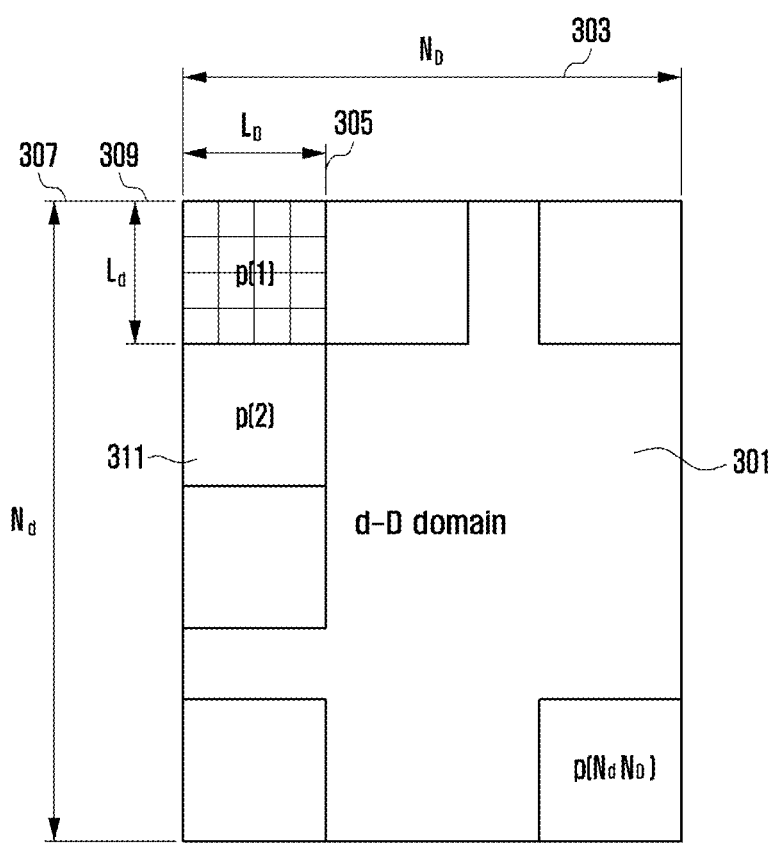
FIG. 3 illustrates an example of a resource grid in a d-D area proposed in the disclosure.

FIG. 3 illustrates an example of a resource grid of the area d-D. The domain d-D may be expressed as a two-dimensional grid 301 including Nd block resources 307 indicating delay and ND block resources 303 indicating Doppler. One block 311 within the two-dimensional grid may be uniformly divided into two-dimensional d-D domain resources 305 having the length of Ld and 309 having the length of LD. Such division may be performed according to a degree of time delay and Doppler spread of the channel, and information on the division may be determined by the BS on the basis of maximally allowed delay and a movement speed of the designed UE and preconfigured through a higher-layer signal, or may be configured on the basis of a channel detected through channel estimation and feedback of the channel through an SRS or a CSI-RS between the transmitter and the receiver and may include at least one of the methods indicated through the higher-layer signal. The divided resources may include block resources from p(1) to p(Nd,ND).

A method proposed in the disclosure is described below. The transmitter first converts a transmission symbol (or transmission information) to binary information through sparse mapping. The binary information is a value of 0 or 1, and the sparse mapping is mapping using transformed vectors having the very small number of 1 included therein. There are various methods for the sparse mapping and, for example, a method of transforming a specific location of the transform vector to 1 may be used. In the method of transforming a transmission symbol of 2 bits to a sparse vector of 4 bits, 00 can be transformed to 1000, 01 can be transformed to 0100, 10 can be transformed to 0010, and 11 can be transformed to 0001. Each of the transformed sparse vectors includes one 1, and thus scarcity K is expressed as 1.

Thereafter, the transformed vector is mapped to the d-D resource grid and transformed to a signal of the t-f domain. Some of the signals in the domain t-f transformed according to scheduling are selected and transmitted through OFDM signals.

The receiver first receives the OFDM symbol and converts the same to the signal in the domain d-D. The receiver may use a compressed sensing (CS)-based reception algorithm, and may identify whether there is information on the signal in the d-D domain for each d-D block resource in order to reconstruct a desired binary signal through CS energy detection. The reconstructed binary signal is converted into the original symbol through sparse demapping.

Hereinafter, the proposed transmission method is described in more detail. When a binary transmission vector (that is, one or more transmission symbols) transmitted in the delay-Doppler domain is s, a sparse vector p may be acquired by a function f (s; b; M; K). That is, the stream of each bit(s) corresponding to each binary transmission vector s is mapped to an M-dimensional sparse vector (here, for example, M=bNdND/Ns, Ns being the length of s) by a mapper having scarcity K. As a result, the maximum number of resources in the d-D domain is Nd×ND blocks, and data (0 or 1) is mapped to each block. Accordingly, mapped p may be expressed as the following sparse matrix P.

$$P = \begin{bmatrix} p(1)1_{L_D \times L_d} & \cdots & p((N_d-1)N_D)1_{L_D \times L_d} \\ \vdots & \ddots & \vdots \\ p(N_d)1_{L_D \times L_d} & \cdots & p(N_d N_D)1_{L_D \times L_d} \end{bmatrix} \quad \text{[Equation 1]}$$

1LD×Ld is a matrix in which a (LD/2)th value and a (Ld/2)th value are 1 and the remaining values are 0. When the sparse matrix P is spread in the t-f domain, a two-dimensional transmission signal X may be generated through [Equation 2] below.

$$X = \Phi \diamond F_{N_F} P F_{N_T}^H = F_{N_F} \Phi' P F_{N_T}^H, \quad \text{[Equation 2]}$$

A∘B is the Hadamard product between A and B matrixes. FNF is a Fourier transform matrix having the size of N, Φ is a selection matrix of selecting m columns in the t-f domain, and Φ is a matrix obtained through substitution of Φ in the d-D domain. Φ serves to select a frequency band, and the transmitter performs additional compression in the frequency domain in order to configure a protection band for managing user multiplexing or/and potential interference between adjacent channels on the basis of Φ.

Through the above procedure, a total of 2-step compression is applied to transmission of the vector s, wherein the first compression is sparse compression in the d-D domain and the second compression corresponds to compression through frequency band mapping in the t-f domain.

Figure 4:
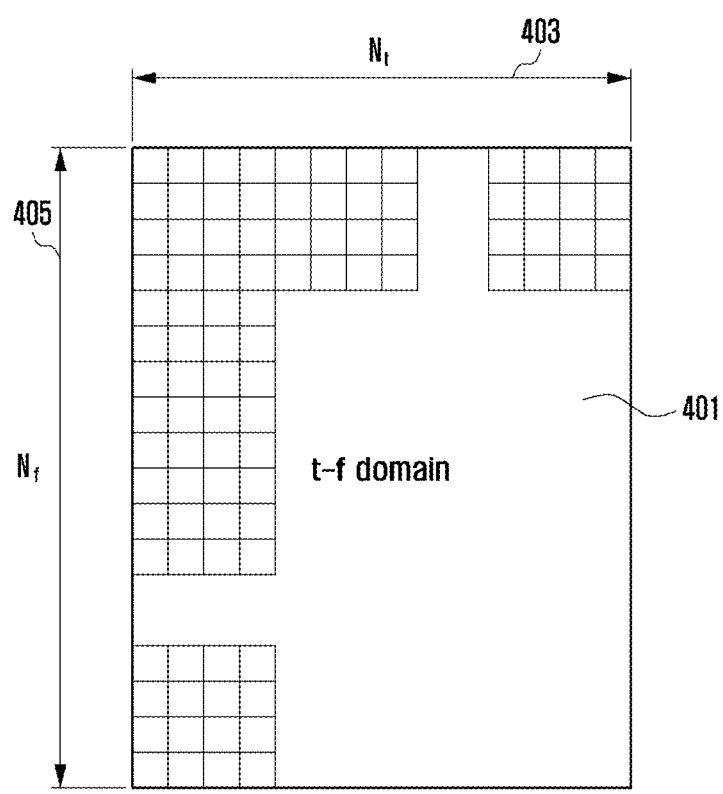
FIG. 4 illustrates an example of spread to a t-f domain proposed in the disclosure.

FIG. 4 illustrates an example of spread to the t-f domain proposed in the disclosure. That is, p blocks configured in FIG. 3 are spread in a two dimension of a time 403 and a frequency 405 in FIG. 4. Since transform to the t-f domain is performed by the size of FFT, information on all P blocks are uniformly spread to two-dimensional resources 401. However, actual transmission of all of the information may be impossible in the communication system. Transmission of a signal through specific frequency resources in the communication system is needed to construct multiplexing and/or protection bands with other users.

Figure 5:
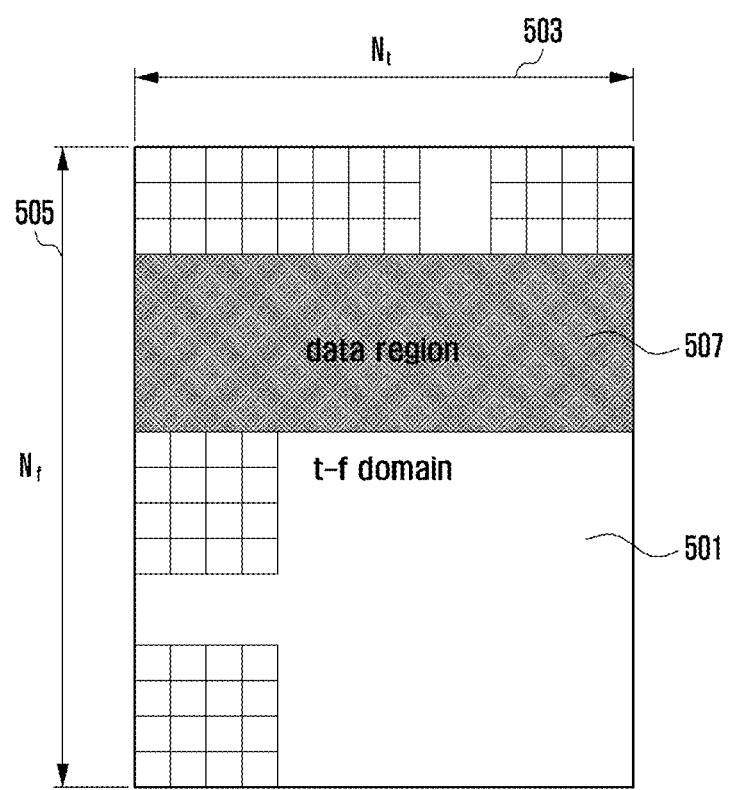
FIG. 5 illustrates an example of allocation of t-f domain resources proposed in the disclosure.

FIG. 5 illustrates an example of allocation of t-f domain resources proposed in the disclosure. Information on spread P blocks is transmitted in some areas 507 in the bans of a time 503 and a frequency 505 as shown in FIG. 5. At this time, the method is determined by a higher-layer signal or a predefined rule in the first compression (sparse compression in the d-D domain) and the transmitter transfers the location and the length of frequency bands through which a signal is transmitted using a control channel or a higher-layer signal in the second compression (signal transmission in some areas of the t-f domain). Specifically, information for the first compression may include at least one of the length of Ld and/or LD, the number of Nd and/or ND, the number of NF and/or NT, the length of sparse vectors, a method of a rule of sparse mapping, and scarcity K. Further, information for the second compression may include information on a frequency band in which a signal is transmitted, the location of a subcarrier, frequency resources and/or time resources expressed in predetermined or preconfigured units, and the location of a time symbol.

The transmitted signal may be received by the receiver via a channel and is expressed as a vector such that a reception vector yn in a symbol n may be expressed as shown in [Equation 3].

$$y_n = G_n F_{N_F}^H x_n + z_n, \quad \text{[Equation 3]}$$

Gn is a channel matrix, xn is an nth column vector of a matrix X, and z is a noise vector indicating additive white Gaussian noise. The channel matrix G can be disassembled as shown in [Equation 4].

$$G_n = F_{N_F}^H \Lambda_n F_{N_F}, \quad \text{[Equation 4]}$$

A matrix Λn expresses a frequency channel value in a diagonal form. That is, when a frequency channel vector is hn, $\Lambda_n = \sqrt{N_F} F_{N_F}^H \text{diag}(h_n)$, and [Equation 5] below is obtained by applying [Equation 4] to [Equation 3].

$$y_n = \sqrt{N_F} F_{N_F}^H \text{diag}(X_n) h_n + z_n. \quad \text{[Equation 5]}$$

Since the signal compressed in the d-D domain is transmitted to NT symbols, a matrix Ŷ=[y₁ ... y_{N_T}] in which N_T symbols are gathered may be expressed as [Equation 6] below.

$$\hat{Y} = \Phi F_{N_F}^H Y F_{N_T} = \Phi \sqrt{N_F} \Phi'(U \circ P) + \hat{Z}, \quad \text{[Equation 6]}$$

The received signal is transformed to the d-D domain. U corresponds to a d-D channel response of H=[h₁ ... h_{N_T}] and Z=ΦF_{N_F}^H ZF_{N_T} [Equation 6] may be simply expressed as [Equation 7].

$$\hat{Y} = \hat{\Phi} \hat{P} + \hat{Z},$$

$$\hat{\Phi} = \Phi \sqrt{N_F} \Phi', \hat{P} = U \circ P \quad \text{[Equation 7]}$$

[Equation 7] is divided in a submatrix form in order to reconstruct a received signal using a CS algorithm, and [Equation 8] is obtained by applying the same.

$$\bar{Y} = \bar{\Phi} \bar{P} + \bar{Z}, \quad \text{[Equation 8]}$$

A transform symbol means transform as shown in [Equation 9] below.

$$\overline{A} = \begin{bmatrix} \hat{A}(1:L_D) \\ \vdots \\ \hat{A}((N_D-1)L_D):N_DL_D) \end{bmatrix} \dot{\Phi}' = \text{diag}(\dot{\Phi} \ldots {}'\overline{\dot{\Phi}}) \quad \text{[Equation 9]}$$

Finally transformed [Equation 9] may be expressed as follows.

$$\overline{Y} = \begin{bmatrix} \sum_1 & \cdots & \sum_{N_dN_D} \end{bmatrix} \begin{bmatrix} D_1 \\ \vdots \\ D_{N_dN_D} \end{bmatrix} + \overline{Z}, \quad \text{[Equation 10]}$$

$$\sum_i = [\dot{\Phi}(:,i) \ldots \dot{\Phi}(:,i)] = D_i = p(i)G \circ 1_{L_D \times L_d}$$

G is a d-D domain channel response, and is the same for all of the d-D domain resource blocks due to two-dimensional circular correlation properties between t-f and d-D domains. The receiver may select resource blocks sequentially from the highest energy according to each resource block for [Equation 10]. This is expressed by [Equation 11] below.

$$\arg\max_{\|x\|_0 = KM} P_r(\overline{Y}|\overline{P}, \dot{\Phi}), \quad \text{[Equation 11]}$$

Since the matrix P includes 0 and 1, the operation of the receiver is the same as detection of energy of resource blocks to which 1 is mapped through ad-D channel. Accordingly, the receiver which does not need to use a pilot signal may reconstruct a transmitted signal by observing the d-D area in which energy of the entire channels is received. Further, since one data symbol is distributed to several t-f resources without being mapped to specific resources of the t-f domain, the robustness to interference generated due to phase noise can be achieved. The received signal is the same as two-dimensional convolution of a channel impulse response using a sparse vector in the d-D domain. As a result, information is transmitted according to whether there is a signal in a specific resource block of the d-D domain resource grid.

Figure 6:
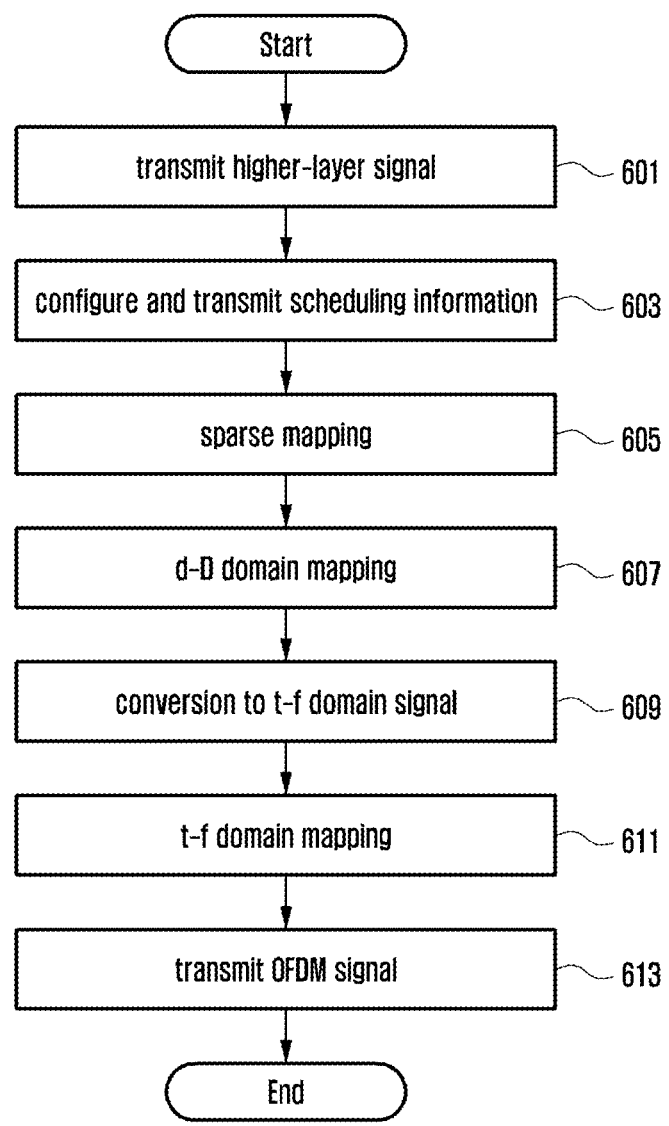
FIG. 6 illustrates a transmission operation of a transmitter proposed in the disclosure.

FIG. 6 illustrates a transmission operation of the transmitter proposed in the disclosure. Referring to FIG. 6, the transmitter configures configuration information for compression transmission of the method proposed in the disclosure and transfers the configuration information to the receiver through a layer signal in operation 601. The configuration information for compression transmission may include at least one piece of information on the length of Ld and/or LD, the number of Nd and/or ND, the number of NF and/or NT, the length of sparse vectors, a method or a rule of sparse mapping, and scarcity K, and some of the information may be predetermined and thus may not be transmitted. Thereafter, the transmitter determines detailed scheduling information, particularly, allocation information in the frequency axis, and transmit the information to the receiver through a control channel or higher-layer signaling in operation 603. The scheduling information may include information on frequency band resources and/or time resources for transmitting the converted signals through the method proposed in the disclosure which corresponds to information for second compression as described above.

The transmitter converts transmitted signals into sparse vectors through the above-described method in operation 605 and maps the same to preconfigured d-D domain block resources in operation 607. The transmitter converts the mapped signals into t-f domain signals through the above-described method in operation 609 and allocates the same to t-f domain resources on the basis of scheduling information such as the frequency allocation determined in operation 603. At this time, the transmitter may multiplex the converted signals with other signals. Thereafter, the transmitter converts the converted signals into OFDM signals and transmits the same to the receiver in operation 613.

Figure 7:
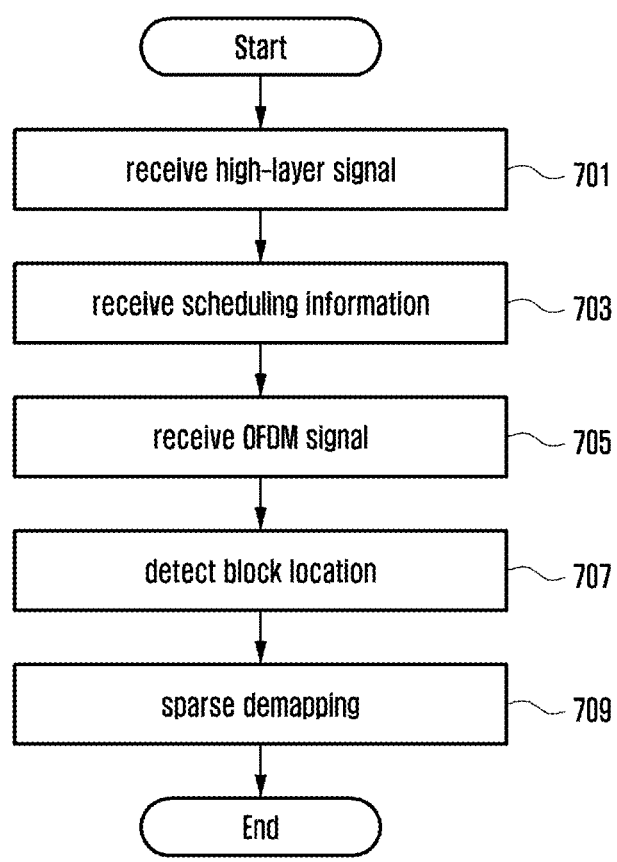
FIG. 7 illustrates a reception operation of a receiver proposed in the disclosure.

FIG. 7 illustrates a reception operation of the receiver proposed in the disclosure. Referring to FIG. 7, the receiver receives configuration information for compression transmission such as sparse vector compression, a mapping rule, resource configuration information of the d-D domain from the transmitter through a higher-layer signal in operation 701. The configuration information for compression transmission may include at least one piece of information on the length of Ld and/or LD, the number of Nd and/or ND, the number of NF and/or NT, the length of sparse vectors, a method or a rule of sparse mapping, and scarcity K, and some of the information may be predetermined and thus may not be transmitted. Thereafter, the receiver receives scheduling information (that is, OFDM signal allocation information) in the actual t-f domain through the higher-layer signal or the control channel in operation 703. The scheduling information may include information on frequency band resources and/or time resources for transmitting the converted signals proposed in the disclosure which is information for second compression as described above. The receiver receives OFDM signals according to the scheduling information received in operation 703. Thereafter, in order to reconstruct the original signals, the receiver may reconstruct sparse vectors of the d-D domain transmitted through a method of measuring the size of energy for each d-D domain resource block through signal processing as proposed in the disclosure and reconstruct the original signals by performing sparse vector demapping on the reconstructed sparse vectors.

Figure 8:
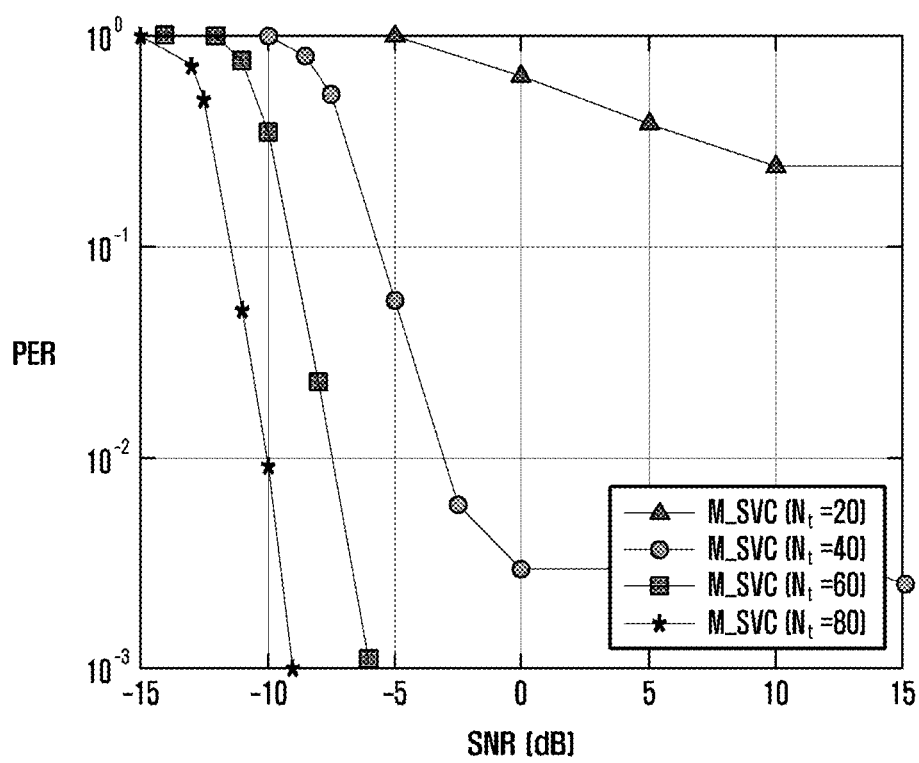
FIG. 8 illustrates the performance according to an embodiment proposed in the disclosure.

FIG. 8 is a diagram illustrating the performance according to an embodiment proposed in the disclosure. FIG. 8 illustrates the performance in the case in which the length of symbols used for data transmission is variable.

In FIG. 8, the packet error rate (PER) performance is illustrated according to a signal-to-noise ratio (SNR) when the number Nt of symbols for transmitting signals is 20, 40, 60, and 80. This means that transmission is performed with the constant size of d-D domain resource blocks but the variable length of LD included in the blocks. On the basis of the result, it is possible to observe influence of interference between blocks in the d-D domain according to constant Doppler spread. According to FIG. 8, when Nt=60 and 80 are used in SNR=−6.5 and −9 dB, 0.001 PER can be achieved. On the other hand, when Nt is small like 20 to 40, the performance deteriorates and the PER becomes worse even though the SNR is high. This is because an error is generated due to interference between resource blocks made in the d-D domain, which is a phenomenon similar to interference between symbols in the t-f domain. That is, in order to effectively perform the method proposed in the disclosure, it is important to properly configure d=−D domain block resources (sizes of LD and Ld) on the basis of Doppler spread statistics of the channel to avoid the interference. To this end, the transmitter and the receiver may acquire a channel state before performing the disclosure, proposed in the disclosure.

Figure 9:
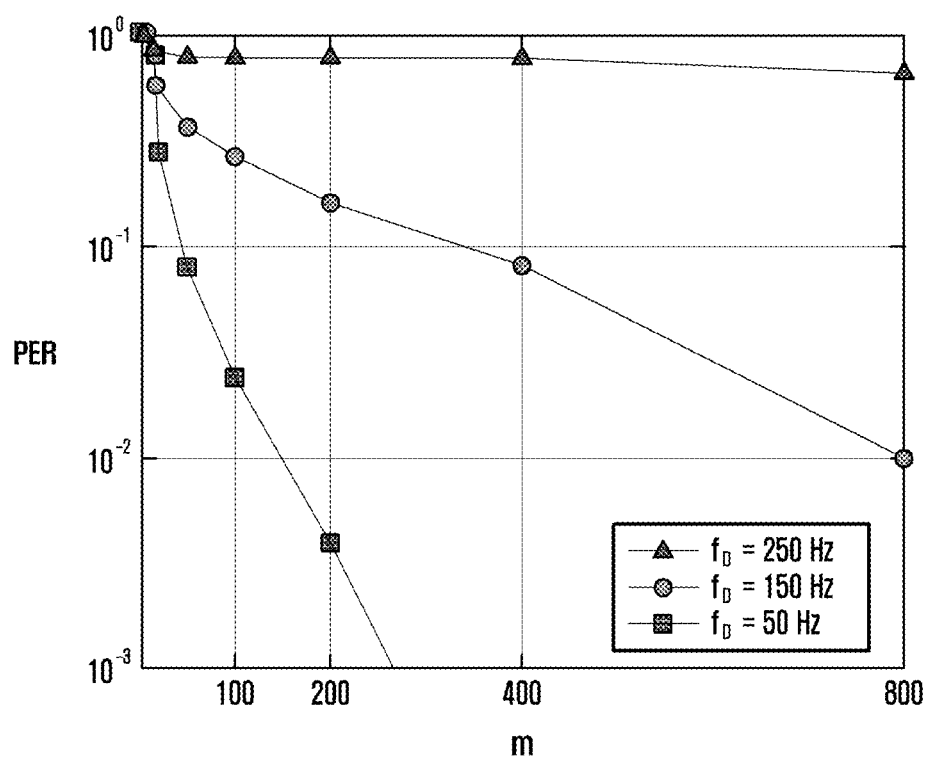
FIG. 9 is another diagram illustrating the performance according to an example proposed in the disclosure.

FIG. 9 is another diagram illustrating the performance according to an example proposed in the disclosure. FIG. 9 illustrates the performance when the size of a frequency band is changed at various Doppler speeds.

FIG. 9 shows how sensitive the technology proposed in the disclosure is to a Doppler frequency (fD) in the frequency axis and a compression rate m (%) in the frequency axis. As known in the result of FIG. 9, when a proper Doppler domain block distance LD is configured for the Doppler frequency, 0.1 PER (general data transmission requirements in the cellular network) can be achieved even though transmission is performed using only frequency resources of about 40% compared to the bandwidth. When the Doppler frequency is further reduced (when the UE speed decreases), the data transmission requirements can be achieved even though only subcarriers of about 10% are used compared to the bandwidth. Accordingly, the proposed method can show that frequency area compression at a high level is possible.

Figure 10:
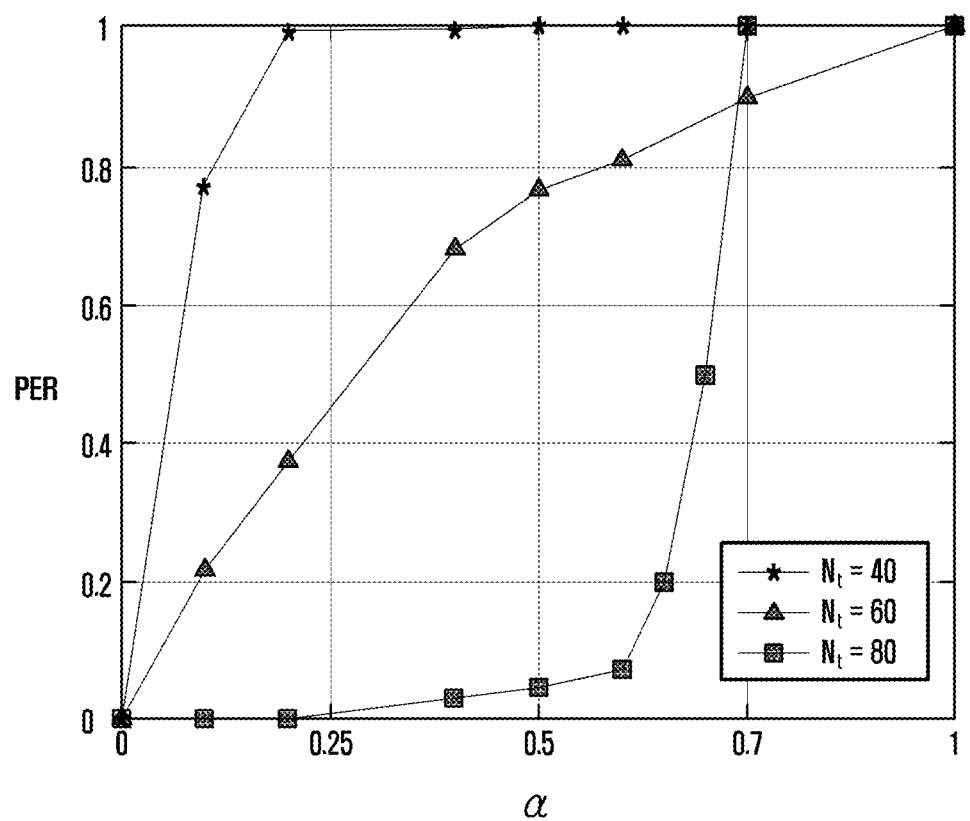
FIG. 10 is another diagram illustrating the performance according to an example proposed in the disclosure.

FIG. 10 is another diagram illustrating the performance according to an example proposed in the disclosure. FIG. 10 illustrates the performance when a degree of sparse mapping and the size of time symbols used for transmission are changed.

FIG. 10 illustrates the PER performance result according to scarcity of the d-D area when the number Nt of time symbols for transmitting signals is changed. Here, a scarcity rate α is used to compare scarcity, which means the number of blocks actually used for transmission between all of M blocks. When Nt is very large (for example, Nt=80), 0.1 PER can be achieved even though α>0.5, but the PER is more sensitive to the scarcity rate α as Nt is smaller. For example, in the case of Nt=40, 0.01 PER cannot be achieved even though signals are transmitted only to one or two blocks.

Figure 11:
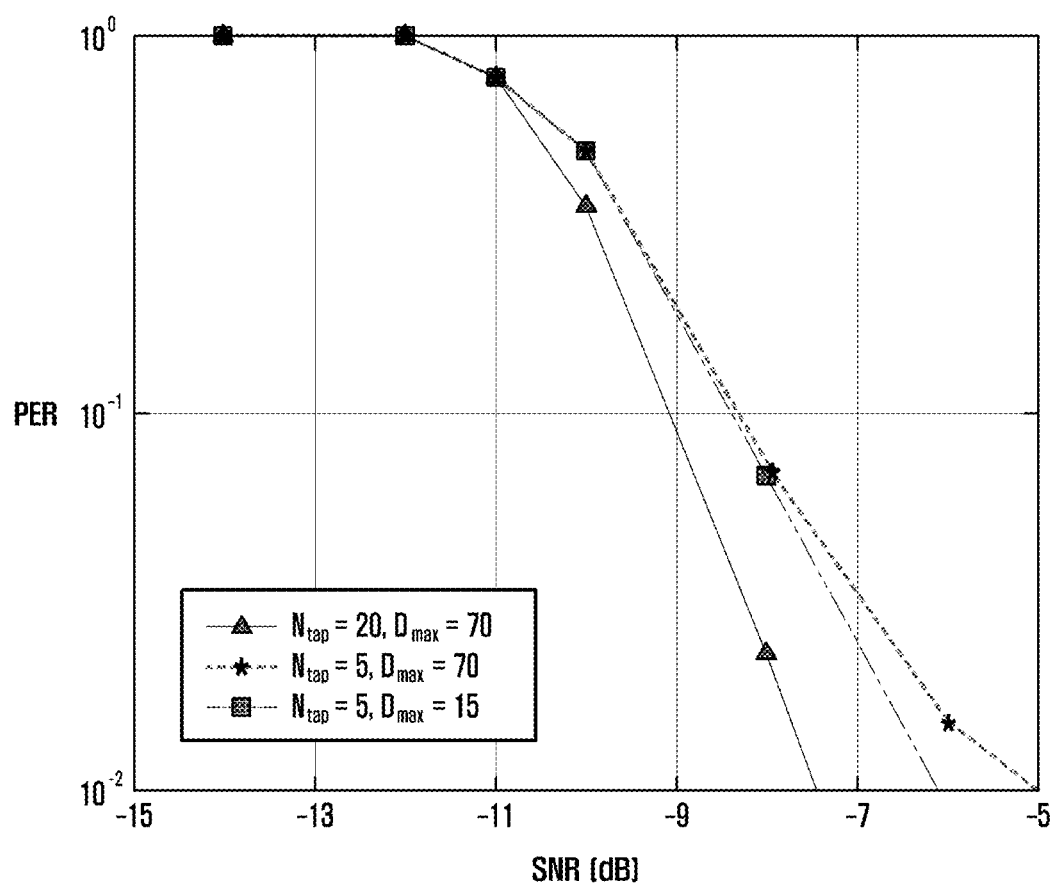
FIG. 11 is another diagram illustrating the performance according to an example proposed in the disclosure.

FIG. 11 is another diagram illustrating the performance according to an example proposed in the disclosure. FIG. 11 illustrates the performance of the method proposed in various channel conditions.

In FIG. 11, the PER performance according to channel characteristics such as maximum delay spread (Dmax) and the number (Ntap) of taps of channels is illustrated according to the SNR. When Ntap is 20, Dmax is 70, and 20 taps are uniformly and randomly distributed over 70 taps to generate channels having high selectivity in the frequency domain. It is observed that an average delay interval between taps increases and finally channel selectivity further increases when Ntap is reduced with the same Dmax. On the other hand, when Dmax is reduced, channel selectivity decreases. As a result, as channel selectivity increases, the SNR required for reception at 0.01 PER may be reduced but influence of a channel in the t-f domain channel is small. This means that the proposed method is insensitive to phase noise added by the t-f domain.

Figure 12:
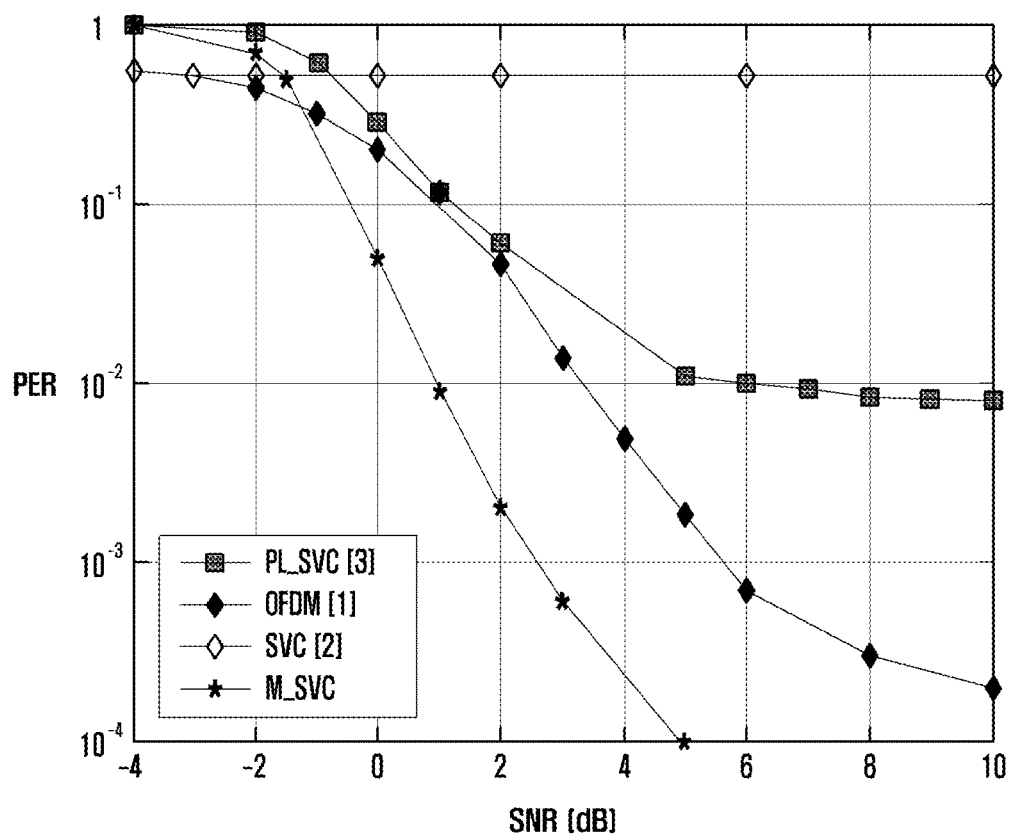
FIG. 12 is another diagram illustrating the performance according to an example proposed in the disclosure.

FIG. 12 illustrates the performance according to a fifth embodiment proposed in the disclosure. FIG. 12 illustrates comparison of the performance with various conventional schemes.

FIG. 12 illustrates comparison of the PER performance according to multi-dimensional sparse vector compression (M-PVS) of the disclosure with the conventional technologies such as OFDM [1], SVC [22] and PL-SVC [3]([1] Zaidi, Ali, et al. "5G Physical Layer: principles, models and technology components," Academic Press, 2018 [2] H. Ji et al., "Sparse Vector Coding of Control Channel for Ultra-Reliable and Low Latency Communications," IEEE Trans. Wireless Commun., 2017 [3] H. Ji, et al., "Pilot-Less Sparse Vector Coding for Short Packet Transmission," IEEE Commun. Lett., vol. 8, no. 4, 2019.). The OFDM scheme uses 30% of resources used for transmitting signals as overheads for two-dimensional pilot signal transmission. In the case of sparse vector coding (SVC), a pilot symbol is needed for decoding, but transmission is performed without pilot symbol and resources used for SVC and pilot-less sparse vector coding (PL-SVC) are the same. As a result, since the SVC cannot be efficiently performed without the pilot symbol, the performance of the SVC is lowest. In the case of PL-SVC, the main assumption of a decoding algorithm is that a channel coefficient is almost constant during a data transmission interval. Accordingly, the performance deterioration due to a channel change by Doppler is observed even in the high SNR. Compared to the OFDM, the method (M-SVC) proposed in the disclosure has low spectral efficiency but can acquire better PER performance without overhead by the pilot signal in the t-f domain, that is, without channel estimation. This is useful for a system considering that energy efficiency is more important than spectral efficiency like a data network through a very large mmWave or Terra Hertz spectrum having significantly large frequency band resources. Further, each performance operation according to the proposed M-SVC can be rapidly processed through software of the transceiver without addition of hardware.

Figure 13:
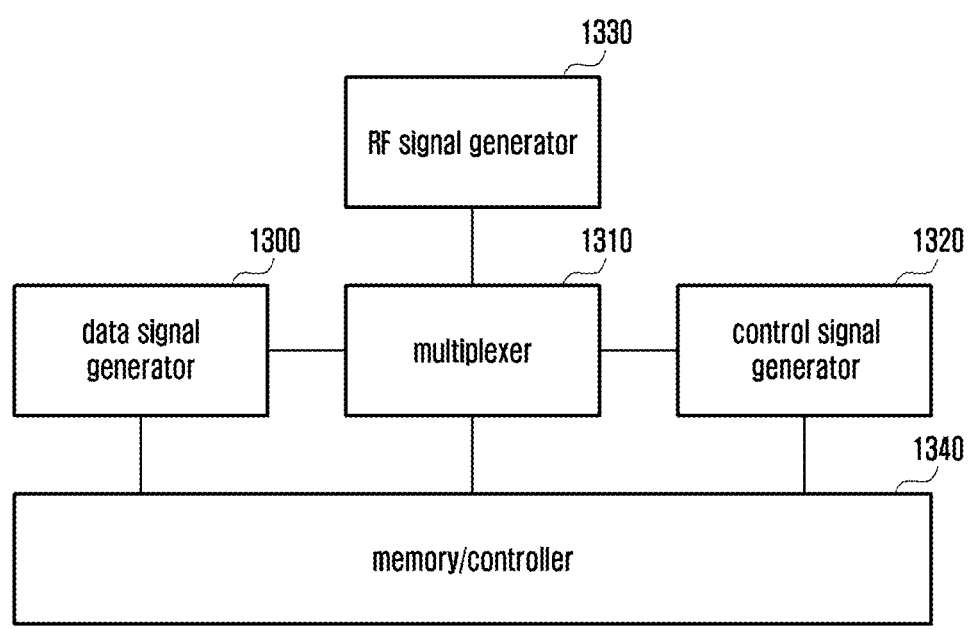
FIG. 13 is a block diagram illustrating the structure of the transmitter according to an embodiment of the disclosure.
Figure 14:
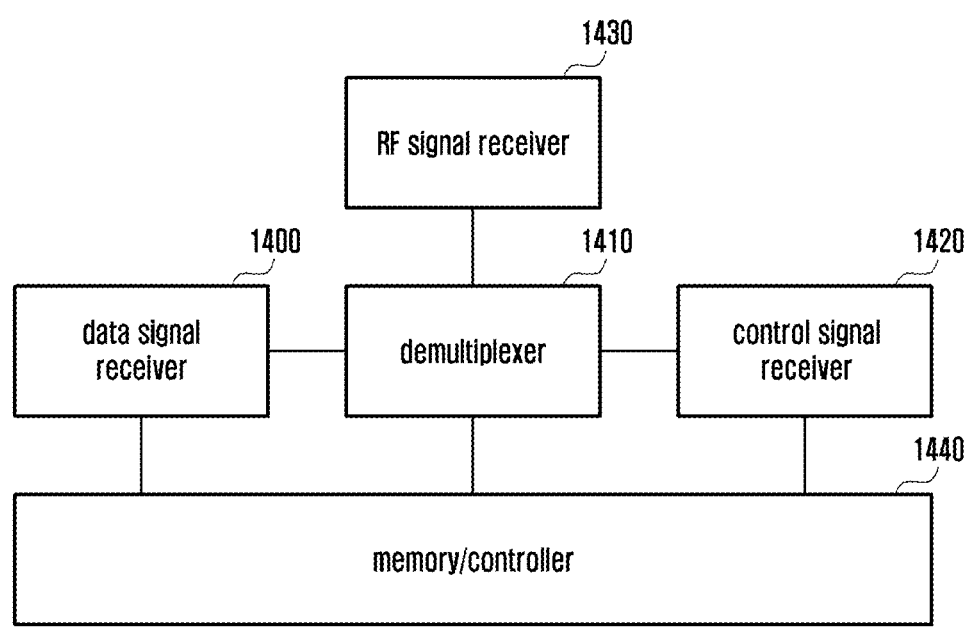
FIG. 14 is a block diagram illustrating the structure of the receiver according to an embodiment of the disclosure.

In order to implement the above-described embodiments, transceivers, memories, and processors of the UE and the UB are illustrated in FIGS. 13 and 14, respectively.

FIG. 13 is a block diagram illustrating the structure of the transmitter according to an embodiment of the disclosure. The transmitter may be a BS or a UE.

Referring to FIG. 13, the transmitter may include a data signal generator 1300, a multiplexer 1310, a control signal generator 1320, an RF signal generator 1330, and a memory/controller 1340. However, the elements of the transmitter are not limited thereto, and, for example, the UE may include more or fewer elements than the above-described elements. Further, the data signal generator 1300, the multiplexer 1310, the control signal generator 1320, the RF signal generator 1330, and the memory/controller 1340 may be implemented in the form of one chip.

According to an embodiment of the disclosure, the data signal generator 1300 is a device for modulating a transmission symbol to generate α transmission sample. The control signal generator 1320 is a device for modulating control information and generating a transmission sample. The multiplexer 1310 is a device for multiplexing the generated data and control signal. The RF signal generator 1330 is a device for converting a digital signal into an analog signal, up-converting the analog signal into an RF signal, and transmitting the generated signal to an antenna, and the signal may include control information and data. Further, the RF signal generator 1330 may be referred to as a transmitter, a transceiver, or the like.

According to an embodiment of the disclosure, the memory/controller 1340 may store a program and data required for the operation of the BS. Further, the memory/controller 1340 may store control information or data included in the signal transmitted by the transmitter. The memory/controller 1340 may be configured by storage media such as ROM, RAM, hard disc, CD-ROM, and DVD, or a combination of the storage media. Further, the memory/controller 1340 may be configured by a plurality of memories and processors. According to an embodiment of the disclosure, the memory/controller 1340 may store information for rapid data processing, data, and programs. Further, the operation performed by the multiplexer 1310, the control signal generator 1320, and the data signal generator 1300 can be performed by the memory/controller 1340.

According to an embodiment of the disclosure, the memory/controller 1340 may control a series of processes according to the operation of the transmitter according to embodiments of the disclosure.

FIG. 14 is a block diagram illustrating the structure of the receiver according to an embodiment of the disclosure. The receiver may be a UE or a BS.

Referring to FIG. 14, the UE may include an RF signal receiver 1440, a data signal receiver 1400, a demultiplexer 1410, a control signal receiver 1420, and a memory/controller 1440. However, the elements of the UE are not limited thereto, and, for example, the UE may include more or fewer elements than the above-described elements. Further, the RF signal receiver 1430, the data signal receiver 1400, the demultiplexer 1410, the control signal receiver 1420, and the memory/controller 1440 may be implemented in the form of one chip.

According to an embodiment of the disclosure, the RF signal receiver 1430 may receive a signal of the transmitter. The signal may include control information and data. To this end, the RF signal receiver 1430 may be configured by an RF receiver for down-converting and amplifying a frequency of the received signal. Further, the RF signal receiver 1430 may be referred to as a receiver, a transceiver, or the like. In addition, the signals are transmitted to the respective receivers, that is, the control channel is transmitted to the control signal receiver 1420 and the data channel is transmitted to the data signal receiver 1400 through the demultiplexer 1410, and the data signal may be reconstructed by the memory/controller 1440 on the basis of a reconstructed command from the control channel.

According to an embodiment of the disclosure, the memory/controller 1440 may store programs and data required for the operation of the receiver. Further, the memory/controller 1440 may store control information or data included in the signal transmitted by the transmitter. The memory/controller 1440 may be configured by storage media such as ROM, RAM, hard disc, CD-ROM, and DVD, or a combination of the storage media. Further, the memory/controller 1440 may be configured by a plurality of memories. According to an embodiment of the disclosure, the memory/controller 1440 may store information for rapid data signal processing, data, and programs therefor. Further, the operation performed by the demultiplexer 1410, the control signal receiver 1420, and the data signal receiver 1400 can be performed by the memory/controller 1440.

According to an embodiment of the disclosure, the memory/controller 1440 may control a series of processes so that the BS can operate according to embodiments of the disclosure.

The methods according to various embodiments described in the claims or the specification of the disclosure may be implemented by hardware, software, or a combination of hardware and software.

When the methods are implemented by software, a computer-readable storage medium for storing one or more programs (software modules) may be provided. The one or more programs stored in the computer-readable storage medium may be configured for execution by one or more processors within the electronic device. The at least one program may include instructions that cause the electronic device to perform the methods according to various embodiments of the disclosure as defined by the appended claims and/or disclosed herein.

The programs (software modules or software) may be stored in non-volatile memories including a random access memory and a flash memory, a read only memory (ROM), an electrically erasable programmable read only memory (EEPROM), a magnetic disc storage device, a compact disc-ROM (CD-ROM), digital versatile discs (DVDs), or other type optical storage devices, or a magnetic cassette. Alternatively, any combination of some or all of them may form a memory in which the program is stored. Further, a plurality of such memories may be included in the electronic device.

In addition, the programs may be stored in an attachable storage device which may access the electronic device through communication networks such as the Internet, Intranet, Local Area Network (LAN), Wide LAN (WLAN), and Storage Area Network (SAN) or a combination thereof. Such a storage device may access the electronic device via an external port. Further, a separate storage device on the communication network may access a portable electronic device.

In the above-described detailed embodiments of the disclosure, an element included in the disclosure is expressed in the singular or the plural according to presented detailed embodiments. However, the singular form or plural form is selected appropriately to the presented situation for the convenience of description, and the disclosure is not limited by elements expressed in the singular or the plural. Therefore, either an element expressed in the plural may also include a single element or an element expressed in the singular may also include multiple elements.

The embodiments of the disclosure described and shown in the specification and the drawings are merely specific examples that have been presented to easily explain the technical contents of the disclosure and help understanding of the disclosure, and are not intended to limit the scope of the disclosure. That is, it will be apparent to those skilled in the art that other variants based on the technical idea of the disclosure may be implemented. Further, the above respective embodiments may be employed in combination, as necessary. For example, a part of one embodiment of the disclosure may be combined with a part of another embodiment to operate α base station and a terminal. As an example, a part of one embodiment of the disclosure may be combined with a part of another embodiment to operate α base station and a terminal. Further, the embodiments of the disclosure may be applied to other communication systems, and other variants based on the technical idea of the embodiments may also be implemented. For example, the embodiments may also be applied to LTE, 5G, or NR systems.

The invention claimed is:

1. A method performed by a transmitter in a communication system, the method comprising:

transmitting, to a receiver, configuration information for transmitting a signal;

identifying resources for transmitting the signal and transmitting, to the receiver, scheduling information indicating the resources;

converting a signal to be transmitted into a compressed signal according to the configuration information;

spreading the compressed signal to multiple dimensions;

mapping a part of the spread compressed signal to the resources corresponding to the scheduling information; and converting the spread compressed signal to generate an orthogonal frequency-division multiplexing (OFDM) signal and transmitting, to the receiver, the generated OFDM signal.

2. The method of claim 1, wherein the configuration information includes at least one of information on a delay-Doppler domain configuration, sparse mapping rule information associated with mapping between transmission information and a sparse vector, or information on frequency bands for the signal to be transmitted.

3. The method of claim 1, wherein the converting of the signal to be transmitted into the compressed signal according to the configuration information comprises mapping transmission information included in the signal to be transmitted to a corresponding sparse vector.

4. The method of claim 3, wherein a sparse vector corresponds to a vector that contains a very small number of 1 values and remaining values are 0.

5. The method of claim 1, wherein,
the spreading of the compressed signal to the multiple dimensions comprises:
mapping a sparse vector to a delay-Doppler domain; and
spreading the mapped sparse vector to time-frequency bands.

6. The method of claim 5, wherein the mapping of the sparse vector to the delay-Doppler domain further comprises mapping bits of the sparse vector to resource blocks included in the delay-Doppler domain.

7. A method performed by a receiver in a communication system, the method comprising:
receiving, from a transmitter, configuration information for receiving a signal;
receiving, from the transmitter, scheduling information for receiving the signal;
receiving, from the transmitter, the signal;
reconstructing a sparse vector from the signal, based on the configuration information and the scheduling information; and
decompressing the reconstructed sparse vectors to acquire transmission information.

8. The method of claim 7, wherein the configuration information includes at least one of information on a delay-Doppler domain configuration, sparse mapping rule information associated with mapping between the transmission information and the sparse vector, or information on frequency bands for receiving the signal.

9. The method of claim 7, wherein the reconstructing the sparse vector comprises:
converting the signal into a delay-Doppler domain signal; and
identifying whether there are resource blocks of the delay-Doppler domain signal and reconstructing the sparse vector corresponding to the transmission information included in the signal based on the identification.

10. The method of claim 9, wherein a sparse vector corresponds to a vector that contains a very small number of 1 values and remaining values are 0.

11. The method of claim 7, wherein the acquiring of the transmission information is performed by applying sparse demapping to the reconstructed sparse vector.

12. A transmitter in a communication system, the transmitter comprising:
a transceiver; and
a controller configured to:
transmit, to a receiver, configuration information for transmitting a signal, identify resources for transmitting the signal and transmit, to the receiver, scheduling information indicating the resources,
convert a signal to be transmitted into a compressed signal according to the configuration information, spread the compressed signal to multiple dimensions, map a part of the spread compressed signal to the resources corresponding to the scheduling information, and convert the spread compressed signal to generate an orthogonal frequency-division multiplexing (OFDM) signal and transmit, to the receiver, the generated OFDM signal.

13. The transmitter of claim 12, wherein the configuration information includes at least one of information on a delay-Doppler domain configuration, sparse mapping rule information associated with mapping between transmission information and a sparse vector, or information on frequency bands for the signal to be transmitted.

14. The transmitter of claim 12, wherein the controller is further configured to map transmission information included in the signal to be transmitted to a corresponding sparse vector.

15. The transmitter of claim 14, wherein a sparse vector corresponds to a vector that contains a very small number of 1 values and remaining values are 0.

16. The transmitter of claim 12, wherein the controller is further configured to map a sparse vector to a delay-Doppler domain, and spread the mapped sparse vector to time-frequency bands.

17. The transmitter of claim 16, wherein the controller is further configured to map bits of the sparse vector to resource blocks included in the delay-Doppler domain.

18. A receiver in a communication system, the receiver comprising:
a transmitter; and
a controller configured to:
receive, from the transmitter, configuration information for receiving a signal,
receive, from the transmitter, scheduling information for receiving the signal,
receive, from the transmitter, the signal,
reconstruct a sparse vector from the signal, based on the configuration information and the scheduling information, and decompress the reconstructed sparse vector to acquire transmission information.

19. The receiver of claim 18, wherein the configuration information includes at least one of information on a delay-Doppler domain configuration, sparse mapping rule information associated with mapping between the transmission information and the sparse vector, or information on frequency bands for receiving the signal.

20. The receiver of claim 18, wherein the controller is configured to convert the signal into a delay-Doppler domain signal and identify whether there are resource blocks of the delay-Doppler domain signal to reconstruct the sparse vector corresponding to the transmission information included in the signal based on the identification.

21. The receiver of claim 18, wherein the controller is further configured to apply sparse demapping to the reconstructed sparse vector.

22. The receiver of claim 20, wherein a sparse vector corresponds to a vector that contains a very small number of 1 values and remaining values are 0.

* * * * *